United States Patent [19]

Noshiro

[11] Patent Number: 5,679,213

[45] Date of Patent: Oct. 21, 1997

[54] METHOD FOR PATTERNING A METAL FILM

[75] Inventor: Hideyuki Noshiro, Kawasaki, Japan

[73] Assignee: Fujitsu Limited, Kawasaki, Japan

[21] Appl. No.: 288,182

[22] Filed: Aug. 9, 1994

[30] Foreign Application Priority Data

Nov. 8, 1993 [JP] Japan .................... 5-278657

[51] Int. Cl.$^6$ .................................. H01L 21/00
[52] U.S. Cl. .................. 156/643.1; 156/646.1; 156/656.1; 204/192.35
[58] Field of Search ............... 156/643.1, 646.1; 216/75, 67; 204/192.35

[56] References Cited

U.S. PATENT DOCUMENTS 3,923,568  12/1975  Bersin ................... 216/75 X
5,320,709  6/1994   Bowden et al. .......... 156/662.1
5,384,009  1/1995   Mak et al. ............ 156/643.1 X

FOREIGN PATENT DOCUMENTS 62-92323  4/1987  Japan .

Primary Examiner—Thi Dang
Attorney, Agent, or Firm—Armstrong, Westerman, Hattori, McLeland & Naughton

[57] ABSTRACT

A method for patterning a metal film comprises a process of removing a part of the metal film not covered with the mask by means of a dry etching method using argon gas and one of a gas containing an element to make a reactive product of the metal film to be wet-etched, and then removing the reactive product which has adhered to the metal film by means of an organic solvent.

10 Claims, 5 Drawing Sheets

METHOD FOR PATTERNING A METAL FILM

BACKGROUND OF THE INVENTION

1. Field of the Invention

The present invention relates to a method for patterning a metal film made of platinum or palladium and a method for manufacturing a semiconductor device including the patterning method.

2. Description of the Related Art

Such dielectric oxide as $SrTiO_3$, $Pb(Zr, Ti)O_3$, and the like is expected to be applied to an electronics field including memory and the like. In case of using dielectric oxide as a dielectric layer in a capacitor, for example, platinum (Pt) or palladium (Pd) is used as electrodes between which the dielectric layer is held.

In case of making a Pt or Pd film into an electrode of a device, patterning of the film is necessary. The patterning is performed through a process as shown in FIGS. 1A to 1D, for example.

First, as shown in FIG. 1A, after photoresist 3 is applied onto a Pt film 2 deposited on a substrate 1, the photoresist 3 is exposed and developed to form a resist pattern. And as shown in FIGS. 1B and 1C, a part of the platinum film 2 not covered with the photoresist 3 is etched off by means of an argon sputter etching method. The reason why a sputter etching method is used in this case is that there is not a reactive gas to generate a reactive product of Pt or Pd which has a vapor pressure in other dry etching methods.

After the above-mentioned process, a process of patterning the Pt film 2 is finished by removing the photoresist 3 with a solvent as shown in FIG. 1D.

The same process is adopted also in case of patterning a Pd film.

By the way, in case of etching a Pt film or Pd film, the argon sputter etching method only physically shaves off these metals but does not sublimate their reactive product through chemically reacting their metals. Therefore, the metal sprung out by the sputtering comes to adhere to side walls of the resist pattern.

When observing the surface of the already patterned Pt film or Pd film by means of a scanning electron microscope (SEM) after removing the resist pattern, it is found that the metal has adhered onto a narrow area along the edge part of the etched area as shown in FIG. 1D.

In case of leaving this as it is, the adhering metal such as Pt or Pd is scattered in the following processes to pollute the device.

SUMMARY OF THE INVENTION

An object of the invention is to provide a method for patterning a metal film, for example a platinum film or a palladium film, for preventing pollution caused by adhesives generated in the patterning process and a method for a semiconductor device including the patterning method.

The present invention use a physical etching gas containing an element to make a reactive product of material sprung out of a metal film, in case of patterning the metal film. The reactive product adhered to the metal film sprung out during the patterning of the metal film is removed easily by using a wet-etching solvent. Thereby, after wet-etching, it is not found that a metal is adhered onto the metal layer along the edge part of the etched area.

The present invention uses a gas containing chlorine or bromine in addition to argon gas used for etching in case of patterning a platinum film or palladium film.

Therefore, after the etching process, a compound of chlorine and platinum or a compound of bromine and compound of chlorine and palladium or a compound of bromine and palladium is formed on the palladium film. Since these chlorides or bromides can be easily removed by such an organic solvent as acetone, ethyl alcohol, or ethyl ether, the adhesives made from the platinum or palladium do not cause pollution.

Furthermore, in case of using a photoresist as a mask, since the photoresist is removed together with the chlorides or bromides at the same time by means of an organic solvent, a process of removing the adhesives is unnecessary. Thus, a process of manufacturing a semiconductor device is improved in throughput by introducing the above-mentioned patterning process into the manufacturing process.

DESCRIPTION OF EMBODIMENTS OF THE INVENTION (First embodiment)

FIGS. 2A to 2D are cross-sectional views showing a patterning process according to a first embodiment of the invention.

Figure 1A:
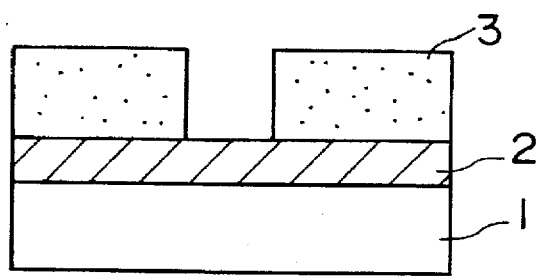
FIGS. 1A to 1D are cross-sectional views showing a process of patterning a platinum film according to the prior art.
Figure 1B:
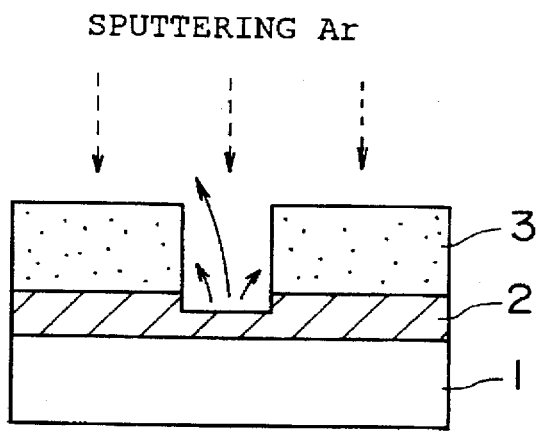
Figure 1C:
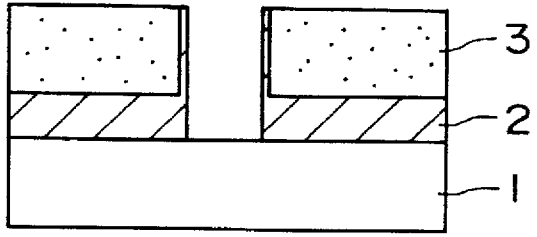
Figure 1D:
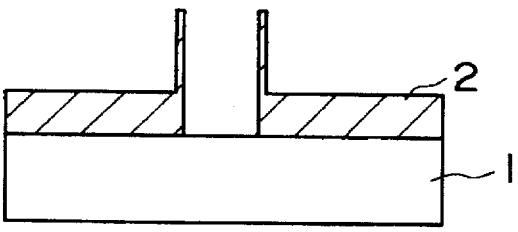
Figure 2A:
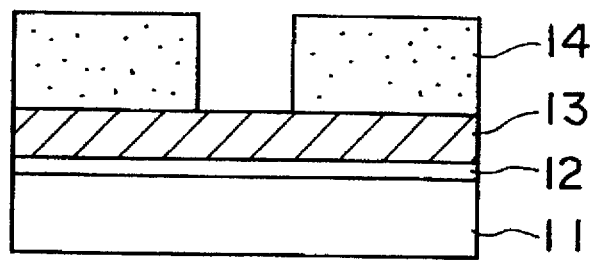
FIGS. 2A to 2D are cross-sectional views showing a process of patterning a platinum film according to a first embodiment of the invention.

First, as shown in FIG. 2A, a Pt film 13 is formed to be 1000 Å in thickness by means of a sputtering method on a silicon oxide film ($SiO_2$ film) 12 formed on the (100) plane of a silicon substrate 11.

When growing the film, a target of platinum is used and the substrate is heated at 300° C. and the growing atmosphere is depressurized to 5 mTorr and then argon (Ar) gas is introduced into the growing atmosphere.

Next, photoresist 14 is applied onto the surface of the Pt film 13 to be 1 μm in thickness and this is exposed by means of an unshown photomask and a low voltage mercury lamp and then the exposed photoresist is developed to form a resist pattern.

Figure 2B:
Figure 2B:
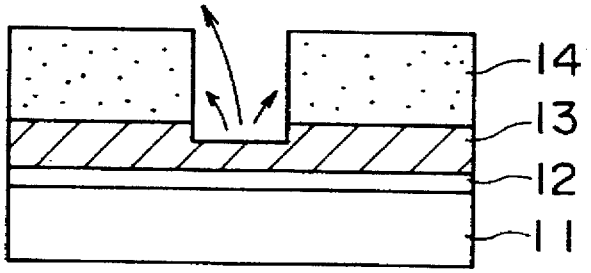
Figure 2C:
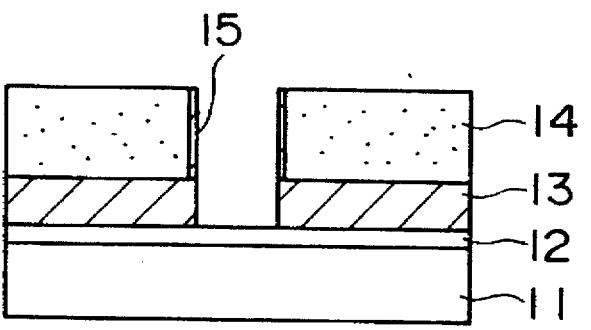

After this, as shown in FIGS. 2B and 2C, a part of the Pt film 13 not covered with the photoresist 14 is etched off by means of a sputter etching method as using the patterned photoresist 14 as a mask. An organic material for example is used as the photoresist 14.

In the sputter etching process, a substrate 11 is set on one electrode of a pair of electrodes which are opposite to each other inside the bell jar of a sputter etching apparatus and the etching atmosphere is depressurized to 6 mTorr and a power to be given between the electrodes is set as 200 W, and argon (Ar) gas and chlorine ($Cl_2$) gas are respectively introduced at flow rates of 50 SCCM and 40 SCCM into the etching atmosphere. This gives an etching speed of 100 Å/minute at which the Pt film 13 is etched off.

The etching is performed by so that ionized argon particles strike against the Pt film 13 to make atoms and molecules of the platinum spring out. At this time, the platinum sprung out in the atmosphere and chlorine are combined with each other to be formed into $PtCl_4$, which is deposited on side walls of the photoresist 14 and on the Pt film 13. In this way, $PtCl_4$ layers 15 of board-fence shape are formed on the side walls.

Figure 2D:
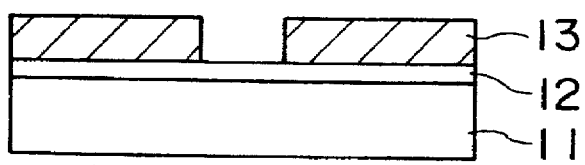

Next, as shown in FIG. 2D, the photoresist 14 is exfoliated as washing the surface of the Pt film 13 with acetone ($CH_3COCH_3$). At this time, since the $PtCl_4$ layers 15 on the side walls of the photoresist 14 dissolve in such an organic solvent as acetone, the layers 15 are removed together with the photoresist 14 from the surface of the Pt film 13.

Thus, in a process of patterning the Pt film 13, no deposited metal is left on the Pt film 13 immediately after removing the photoresist 14. (Second embodiment)

FIGS. 3A to 3D are cross-sectional views showing a patterning process according to a second embodiment of the invention.

Figure 3A:
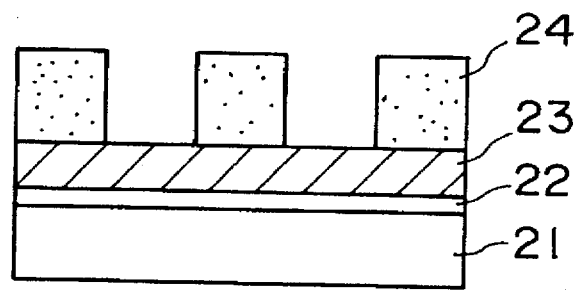
FIGS. 3A to 3D are cross-sectional views showing a process of patterning a palladium film according to a second embodiment of the invention.

First, as shown in FIG. 3A, a palladium film 23 is formed to be 1000 Å in thickness by means of a sputtering method on an $SiO_2$ film 22 formed on the (100) plane of a silicon substrate 21. In growing the palladium film, a palladium target is used and temperature of the substrate is set at 300° C. and the atmosphere is depressurized to 5 mTorr and then argon gas is introduced into the growing atmosphere.

Next, photoresist 24 is applied onto the surface of the Pd film 23 to be 1 μm in thickness and this is exposed by means of an unshown photomask and a low voltage mercury lamp and then the exposed photoresist is developed to form a resist pattern.

Figure 3B:
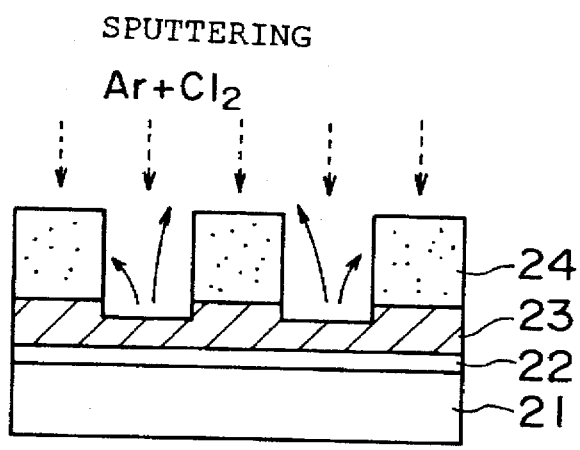
Figure 3C:
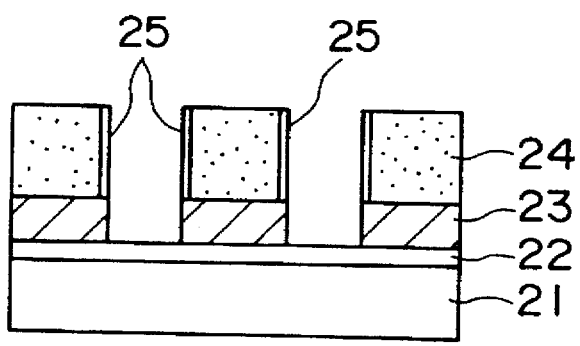

After this, as shown in FIGS. 3B and 3C, a part of the Pd film 23 not covered with the photoresist 24 is etched off by means of a sputter etching method using the patterned photoresist 24 as a mask. In the sputter etching process, the etching atmosphere is depressurized to 6 mTorr and a power to be given between the electrodes is set as 300 W, and argon (Ar) Gas and chlorine ($Cl_2$) gas are respectively introduced at flow rates of 50 SCCM and 50 SCCM into the etching atmosphere. This gives an etching speed of 150 Å/minute at which the Pd film 23 is etched off.

The etching is performed by that ionized argon particles strike against the Pd film 23 to make atoms and molecules of the palladium spring out. At this time, the Pd sprung out in the atmosphere and $Cl_2$ are combined with each other to be formed into $PdCl_2$, which is deposited on side walls of the photoresist 24 and on the Pd film 23. In this way, $PdCl_2$ layers 25 of board-fence shape are formed on the side walls.

Figure 3D:
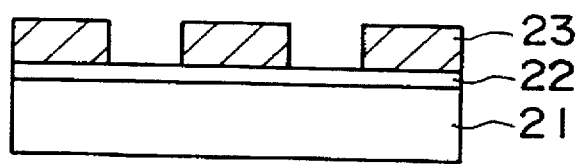

Next, as shown in FIG. 3D, the photoresist 24 is exfoliated as washing the surface of the Pd film 23 with acetone. At this time, since the $PdCl_2$ layers 25 dissolve in an organic solvent in the same manner as the first embodiment, the layers 25 are removed together with the photoresist 24 from the surface of the Pd film 23.

Thus, no deposited metal makes a projection on the surface of the Pd film 23.

(Third embodiment)

In the above-mentioned two embodiments, only patterning processes of a Pt film and a Pd film were described, but a process of manufacturing a capacitor using a platinum film as an electrode is described as an example in the following.

FIGS. 4A to 4H are cross-sectional views showing a patterning process according to a third embodiment of the invention.

Figure 4A:
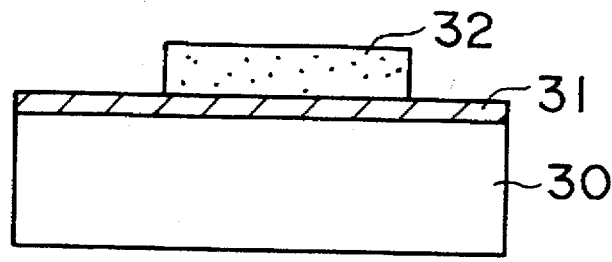
FIGS. 4A to 4H are cross-sectional views showing a process of forming a capacitor according to a third embodiment of the invention.

First, a first Pt film 31 is formed to be 1000 Å in thickness on the (100) plane of a silicon substrate 30 shown in FIG. 4A by means of a sputtering method. The conditions of growing the film are the same as the first embodiment.

Next, photoresist 32 is applied onto the surface of the first Pt film 31 to be 1 μm in thickness and this photoresist 32 is exposed and developed to be left on an area where the lower electrode is formed.

Figure 4B:
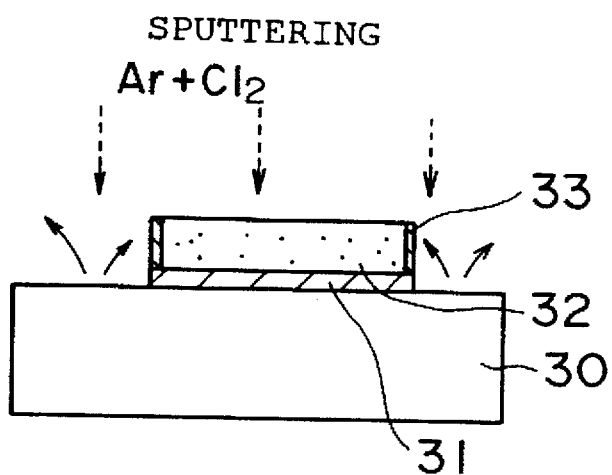

After this, as shown in FIG. 4B, the Pt film 31 is etched with a mixed Gas of Ar and $Cl_2$ by means of a sputter etching method as using the patterned photoresist 32 as a mask. The conditions of etching the film are the same as the first embodiment. The patterned Pt film 31 obtained by this is used as the lower electrode 31A of a capacitor.

In this etching process, Pt particles are sprung out from the Pt film 31 by collision of ionized argon particles. The platinum sprung out is combined with chlorine in the atmosphere to be formed into $PtCl_4$, which is deposited on side walls of the photoresist 32 and on the Pt film 31 as $PtCl_4$ layers 33.

Figure 4C:
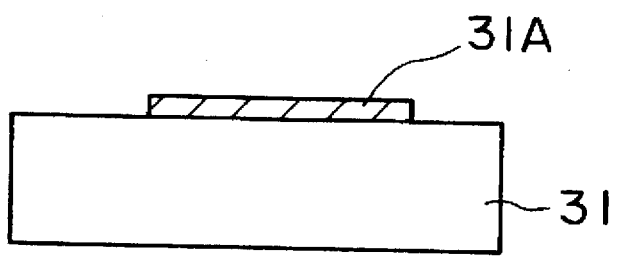

Next, the photoresist 32 is exfoliated as washing the surface of the Pt film 31 with acetone. At this time, since the $PtCl_4$ layers 33 deposited on of the photoresist 32 dissolve in the acetone, the layers 33 are removed together with the photoresist 32 from the surface of the Pt film 31, as shown in FIG. 4C.

Thus, no conductive projection is generated on the surface of the Pt film 31 after patterning the Pt film 31.

Figure 4D:
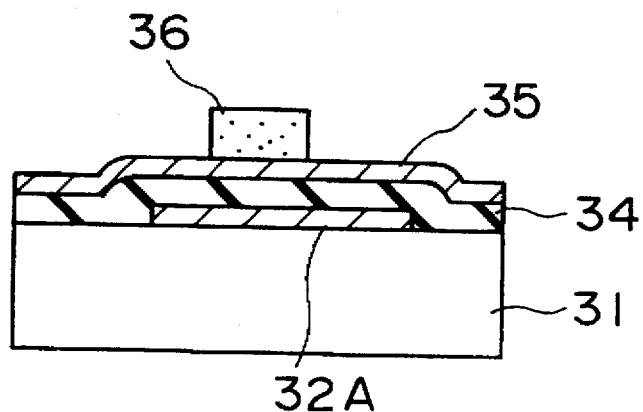

After removing the photoresist 32, a strontium titanate ($SrTiO_3$) film 34 is grown to be 1000 Å in thickness by means of a sputtering method as a dielectric film to compose a capacitor as shown in FIG. 4D. In growing the film 34, an $SrTiO_3$ target is used and temperature of the substrate is set at 600° C. or the less, for example 450° C. and the growing atmosphere is depressurized to 20 mTorr and then argon gas and oxygen ($O_2$) gas are introduced into the sputtering atmosphere at the same rate as each other.

Furthermore, as shown in FIG. 4D, a second Pt film 35 to be the upper electrode of the capacitor is grown to be 1000 Å in thickness by means of a sputtering method. In growing the film 35, temperature of the substrate is set at the room temperature in order to prevent the lower electrode 31A from thermally melting and the other growing conditions are set as the same as the growing conditions of the first Pt film 31.

Next, photoresist 36 is applied onto the surface of the first Pt film 35 to be 1 μm in thickness and this photoresist 36 is exposed and developed to be left on an area above the lower electrode 31A.

After this, the second Pt film 35 is etched by means of a sputter etching method as using the photoresist 36 as a mask. The conditions of etching the film 35 are the same as the first embodiment. In this etching process also, $PtCl_4$ is deposited on side walls of the photoresist 6, but the $PtCl_4$ is removed from the surface of the second Pt film 35 by the acetone to remove the photoresist 36.

Figure 4E:
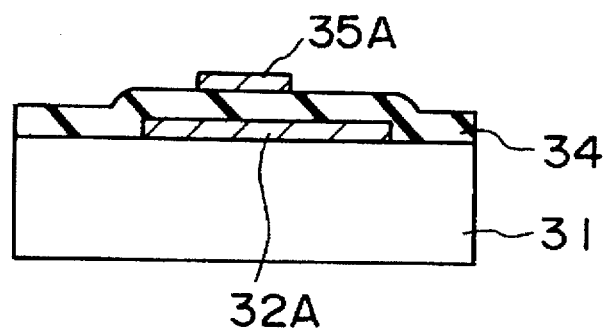

In this manner, the upper electrode 35A of the capacitor is formed as shown in FIG. 4E.

Figure 4F:
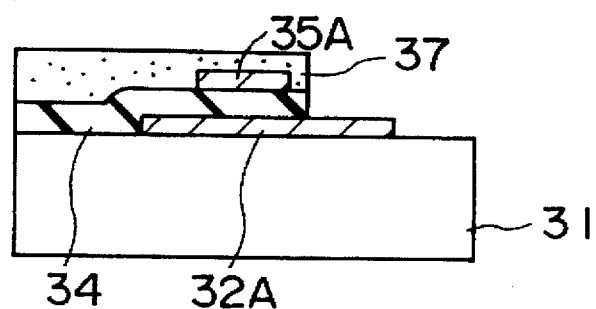

And then, photoresist 37 is applied onto the surface of the upper electrode 35A and the surface of the $SrTiO_3$ film 34, and the photoresist 37 is exposed and developed to be left on an area where a dielectric film of the capacitor is to be formed as shown in FIG. 4F. After this, patterning of the $SrTiO_3$ film 34 is performed by a photolithogrphy method using a sputter etching method as using the photoresist 37 as a mask. In this manner, a capacitor is completed.

Figure 4G:
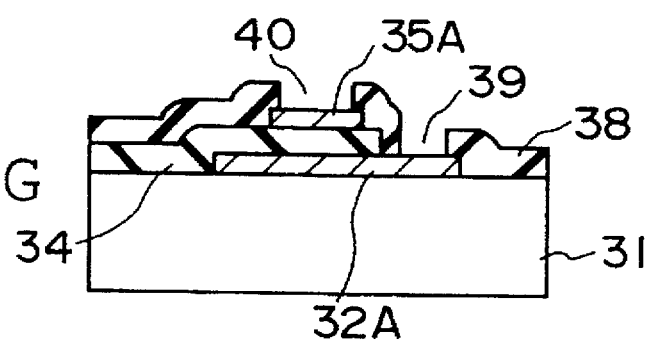

Next, after exfoliating the photoresist 37, an $SiO_2$ film 38 is grown as a protection film by means of a CVD method. After this, patterning of the $SiO_2$ film 38 is performed by means of the photolithography method, and two openings 39 and 40 are formed to expose respectively a part of the lower electrode 31A and a part of the upper electrode 35A as shown in FIG. 4G.

Figure 4H:
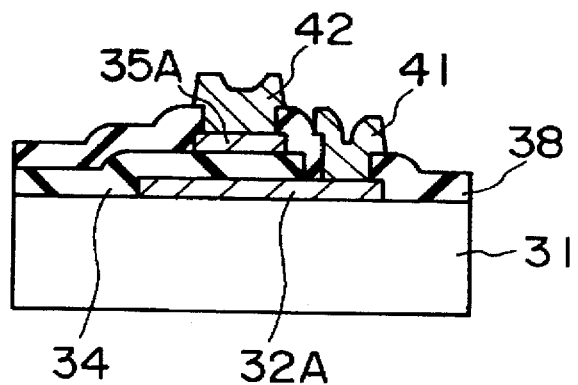

Furthermore, after forming an aluminum film on the whole surface, patterning of the aluminum film is performed by means of the photolithography method and wirings 41 and 42 for leading the lower electrode 31A and upper electrode 35A are formed as shown in FIG. 4H.

(Other embodiments)

In the above-mentioned embodiments, at least chlorine gas is mixed with argon gas when etching a Pt film or Pd film by means of a sputter etching method, but the same result can be obtained also by mixing carbon tetrachloride ($CCl_4$), hydrogen bromide (HBr), boron trichloride ($BCl_3$), or other halogen containing gases with argon gas.

And in the above-mentioned embodiments, at least acetone is used for removing a Pt or Pd compound, but ethyl alcohol ($C_2H_5OH$), ethyl ether ($(C_2H_5)_2O$), or other organic solvents also can be used.

In the above-mentioned embodiments, methods for patterning a metal film made of Pt or Pd are described, but a metal material which is not pure Pt nor pure Pd or contains other metal than Pt or Pd can also give the same action or effect.

A metal film made of Pt or Pd or a metal film containing one of them is used for wiring or electrodes in a semiconductor device.

In the above-mentioned embodiments, a method for patterning a metal film using a sputter etching, and the other physical etching method for patterning is an ion milling.

What is claimed is:

1. A method for patterning a metal film comprising:

forming a metal film made of one of platinum and palladium or a metal film containing one of them;

forming a mask on the metal film;

removing a part of the metal film not covered with the mask by means of a dry etching method using argon gas and a gas containing bromine; and removing bromide which has adhered to the mask by means of an organic solvent.

2. A method for patterning a metal film as defined in claim 1, wherein the dry etching method is a sputter etching method.

3. A method for patterning a metal film as defined in claim 1, wherein the gas containing bromine contains hydrogen bromide.

4. A method for patterning a metal film as defined in claim 1, wherein the mask is photoresist and is removed together with the bromide by means of the organic solvent.

5. A method for patterning a metal film as defined in claim 4, wherein the organic solvent contains one of acetone, ethyl alcohol, and ethyl ether.

6. A method for patterning a metal film comprising;

forming a metal film made of one of platinum, palladium, and a mixture thereof;

forming a photoresist mask on the metal film;

removing a part of the metal film not covered with the photoresist mask by a physical etching method using a physical etching gas and a gas containing an element which makes a byproduct with the metal film sprung out by the physical etching method;

removing both the photoresist mask and the byproduct using an organic solvent.

7. A method for patterning a metal film as defined in claim 1, wherein the physical etching method is a sputter etching method.

8. A method for patterning a metal film comprising;

forming a metal film made of one of platinum and palladium, or a metal film containing one of them;

forming a photoresist mask on the metal film;

removing a part of the metal film not covered with the photoresist mask by means of a dry etching method using argon gas and a gas containing chlorine which makes a chloride with the metal film sprung out by the dry etching method; and removing both the photoresist mask and the chloride with an organic solvent.

9. A method for patterning a metal film as defined in claim 8, wherein the dry etching method is a sputter etching method.

10. A method for patterning a metal film as defined in claim 8, wherein the organic solvent contains at least one of acetone, ethyl alcohol, and ethyl ether.

* * * * *